US012276422B2

United States Patent
Unanue Imaz et al.

(10) Patent No.: US 12,276,422 B2
(45) Date of Patent: Apr. 15, 2025

(54) THERMOELECTRIC SAFETY ASSEMBLY

(71) Applicant: ORKLI, S.COOP., Ordizia (ES)

(72) Inventors: Andoni Unanue Imaz, Idiazabal (ES); Mikel Arizmendi Zurutuza, Ordizia (ES); Juan Herzog Delgado, Ordizia (ES); Marcos Pablo Curto, Hernani (ES)

(73) Assignee: ORKLI, S.COOP., Ordizia (ES)

( * ) Notice: Subject to any disclaimer, the term of this patent is extended or adjusted under 35 U.S.C. 154(b) by 419 days.

(21) Appl. No.: 17/858,576

(22) Filed: Jul. 6, 2022

(65) Prior Publication Data
US 2022/0341593 A1 Oct. 27, 2022

Related U.S. Application Data

(63) Continuation of application No. PCT/ES2021/070004, filed on Jan. 8, 2021.

(30) Foreign Application Priority Data

Jan. 8, 2020 (EP) .................................... 20382004

(51) Int. Cl.
*F23N 5/24* (2006.01)
*H01F 7/06* (2006.01)
*H03K 17/687* (2006.01)

(52) U.S. Cl.
CPC ............ *F23N 5/245* (2013.01); *H01F 7/064* (2013.01); *H03K 17/687* (2013.01); *F23N 2229/00* (2020.01); *F23N 2235/14* (2020.01)

(58) Field of Classification Search
CPC ........ F23N 5/245; H01F 7/064; H03K 17/687
(Continued)

(56) References Cited

U.S. PATENT DOCUMENTS 5,599,181 A 2/1997 Aoki et al.
2006/0275720 A1* 12/2006 Hotton .................... F23N 5/102
431/66
(Continued)

FOREIGN PATENT DOCUMENTS

CN 104022540 A 9/2014
EP 0288390 A1 10/1988
(Continued)

OTHER PUBLICATIONS

International Search Report, PCT/ES2021/070004, Mar. 3, 2021, 11 pages.

*Primary Examiner* — Vivek K Shirsat
(74) *Attorney, Agent, or Firm* — Edell, Shapiro & Finnan, LLC

(57) ABSTRACT

A thermoelectric safety assembly that includes a thermocouple configured to detect a flame in a burner and, in response to detecting the flame, generating an electrical voltage. The assembly includes an electromagnetic valve electrically connected to the thermocouple, and a transistor electrically connected between the thermocouple and the electromagnetic valve. The electromagnetic valve is arranged electrically connected with a field-effect transistor. The assembly also includes a voltage booster configured to power the transistor, the transistor being connected in parallel with the voltage booster. An output terminal of the voltage booster is arranged connected with a gate terminal of the transistor, the voltage booster being configured to boost the electrical voltage generated in the thermocouple, an electrical voltage being obtained that is capable of keeping the transistor closed such that the electromagnetic valve is energized.

8 Claims, 1 Drawing Sheet

(58) Field of Classification Search
USPC .......................................................... 431/80
See application file for complete search history.

(56) References Cited

U.S. PATENT DOCUMENTS

| | | | |
|---|---|---|---|
| 2012/0175539 A1* | 7/2012 | Nebbia | F23N 5/102 251/129.09 |
| 2014/0239713 A1 | 8/2014 | Kanzaki et al. | |

FOREIGN PATENT DOCUMENTS

| | | | |
|---|---|---|---|
| JP | H07324738 A | 12/1995 | |
| JP | H09196362 A | 7/1997 | |
| WO | 2019166680 A1 | 9/2019 | |

* cited by examiner

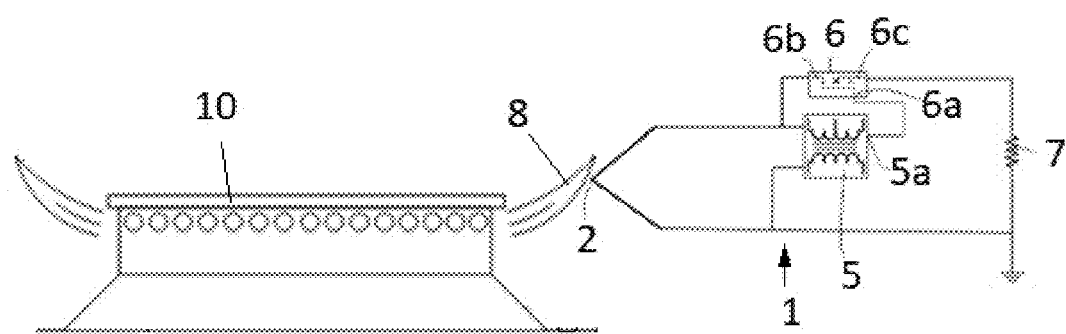

THERMOELECTRIC SAFETY ASSEMBLY

CROSS-REFERENCE TO RELATED APPLICATIONS

This application relates to and claims the benefit and priority to International Application Mo. PCT/ES2021/070004, filed Jan. 8, 2021, which claims the benefit and priority to European Application No. EP20382004.8, filed Jan. 8, 2020.

TECHNICAL FIELD

The present invention relates to a thermoelectric safety device in the absence of flame for gas combustion systems.

BACKGROUND

Cooking appliances with burners are known in the art, each of which burners has associated a thermocouple connected to a respective electromagnetic valve, such that when the thermocouple detects the presence of flame in the burner, it generates a thermoelectric current which at a given time is capable of keeping the electromagnetic valve energized, allowing the passage of gas towards the corresponding burner.

EP 0288390 A1 furthermore describes electric circuits in which a MOSFET is arranged between the thermocouple and the electromagnetic valve, said MOSFET acting as a switch. So, depending on previously established parameters, the MOSFET can open the circuit, preventing the passage of current towards the electromagnetic valve, and therefore, making the electromagnetic valve close the passage of gas towards the burner, regardless of there being presence of flame in the corresponding burner. In electric circuits of this type, the MOSFET must be powered by an external power supply so that it operates as a closed switch for allowing the passage of current towards the electromagnetic valve.

JP H09196362 A describes a cooking appliance comprising a burner, a thermocouple associated with an electromagnetic valve, and a thermoelectric generating device which supplies a battery through a booster. When an ignition operation is completed, a switch opens so that the battery does not feed the ignition device, but the electromagnetic valve remains unchanged. When the combustion flame is reduced by the user setting the flame, the thermoelectromotive force of the thermoelectric generating device is reduced as well. When the output voltage of the power booster drops from one level, the current to the battery is limited through a current limiter, with sufficient voltage being supplied to prevent the electromagnetic valve from disconnecting.

U.S. Pat. No. 5,599,181 A discloses a cooking appliance comprising a burner, a thermocouple connected to a solenoid valve capable of energizing the solenoid valve in the presence of a flame in the burner, a thermoelectric generating element connected to a booster circuit, and a battery. The booster circuit allows to boost the voltage generated by the thermoelectric generating element which is in turn connected to the battery through a load switch and a contact of a multi-contact switch. The cooking appliance can restore a sufficient amount of energy to the battery if the battery energy level falls below a required level without other measures such as a battery replacement being necessary. Only manual operation on manual switches is required to efficiently use the ON/OFF of the multi-contact switch to recharge the battery when the energy has dropped below a limit.

WO 2019/166680 A1 discloses a flame monitoring system comprises a thermocouple adapted for being arranged next to the burner and an electromagnetic gas valve adapted for opening or closing a gas passage to said burner, the electromagnetic gas valve being electrically connected with the thermocouple and said electromagnetic gas valve keeping the gas passage open when it receives a specific current from the thermocouple. The flame monitoring system also comprises interruption means configured for interrupting current flow between the thermocouple and the electromagnetic gas valve during a predetermined time so that the voltage meter can measure the voltage of the thermocouple in vacuum, said predetermined time being such that the electromagnetic gas valve keeps the gas passage open during the interruption by means of the actual inertia of the electromagnetic. The flame monitoring system also includes interrupting means between the thermocouple and the gas electromagnetic valve configured to interrupt current circulation between the thermocouple and the gas electromagnetic valve in an open position and to allow such circulation in a closed position. The interrupting means comprises a MOSFET and is configured to be in the open position in the absence of power supply. The flame monitoring system of the invention comprises an additional power circuit configured to feed such interrupting means for a given time interval in the absence of power from the mains and to cause, with such power, such interrupting means to be arranged and/or maintained in the closed position.

SUMMARY

Disclosed is a thermoelectric safety device in the absence of the flame for gas combustion systems.

The thermoelectric safety device comprises a thermocouple configured to detect a flame in a corresponding burner of the gas combustion systems generating an electrical voltage, an electromagnetic valve electrically connected to the thermocouple and configured to allow the passage of gas towards the corresponding burner when the electromagnetic valve is energized by the thermocouple, and a transistor electrically connected between the thermocouple and the electromagnetic valve. The electromagnetic valve is arranged directly connected with the transistor, the transistor being a field-effect transistor, The thermoelectric safety device comprises a voltage booster powering the transistor, the transistor being connected in parallel with the voltage booster and an output terminal of the voltage booster being arranged connected with a gate terminal of the transistor. The voltage booster is configured to boost the electrical voltage generated in the thermocouple, an electrical voltage being obtained capable of keeping the transistor closed such that the electromagnetic valve is energized.

A thermoelectric safety device is thus obtained which can be actuated regardless of whether there is the flame in the burner, this thermoelectric safety device being self-powered, it not being necessary to power it through any external power supply.

In addition, the disengagement of the electromagnetic valve is controlled by the transistor, i.e., before the electromagnetic valve is disengaged because the sufficient current does not reach it when the thermocouple is cooled down upon the flame of the corresponding burner being turned off, the transistor opens, whereby current automatically does not reach the electromagnetic valve and the electromagnetic valve is disengaged. Therefore, a thermoelectric safety device is obtained which has a greater response time in the absence of the flame without virtually penalizing the time taken for the electromagnetic valve to be energized in the presence of the flame.

In addition, the excess voltage generated in the voltage booster once the transistor has been powered so that it operates as a closed switch can be used for other functions such as powering luminous indicators of the blinking led type, RFID or battery charging systems used in gas cooking appliances.

These and other advantages and features will become evident in view of the figures and of the detailed description.

BRIEF DESCRIPTION OF THE DRAWINGS

FIG. 1 shows an electrical diagram of a thermoelectric safety assembly having a thermocouple powered by a flame of a burner.

DETAILED DESCRIPTION

FIG. 1 shows an electrical diagram of a thermoelectric safety device 1 in the absence of flame for gas combustion systems according to the invention. The thermoelectric safety device 1 comprises a thermocouple 2 configured to detect a flame 8 in the combustion system, in particular in a burner 10 of the combustion system, and an electromagnetic valve 7 electrically connected to the thermocouple 2 and configured to allow or prevent the passage of gas towards the burner. In the presence of flame the thermocouple 2 heats up, an electrical voltage capable of keeping the electromagnetic valve 7 energized being generated allowing the passage of gas towards the corresponding burner 10. In the absence of flame the thermocouple 2 cools down to the point at which an electrical voltage capable of keeping the electromagnetic valve 7 energized cannot be generated, the electromagnetic valve 7 preventing the passage of gas towards the burner 10.

The gas combustion system is preferably a gas appliance incorporating the thermoelectric safety device 1. In particular, the gas apparatus may be a gas cooking top, although the thermoelectric safety device 1 could be incorporated to any other type of gas appliance known in the state of the art, a gas oven for example. Furthermore, the gas appliance can comprise a burner or a plurality of burners, each burner comprising the respective thermoelectric safety device 1. Gas electromagnetic valves are known in the state of the art so their description in this application is not considered necessary.

The thermoelectric safety device 1 further comprises a transistor 6 electrically connected between the thermocouple 2 and the electromagnetic valve 7. The transistor 6 acts as a switch, allowing acting upon the electromagnetic valve 7 regardless of whether the thermocouple 2 detects flame. In other words, by means of a non-depicted control, the electromagnetic valve 7 can be acted upon de-energizing it although the thermocouple 2 detects a flame in the burner.

The thermoelectric safety device 1 comprises a voltage booster 5 powering the transistor 6, the voltage booster 5 being configured to boost the electrical voltage generated in the thermocouple 2, there being obtained at the output of the voltage booster 5 an electrical voltage capable of keeping the transistor 6 closed such that the electromagnetic valve 7 is energized. The voltage booster 5 is configured to boost a no-load voltage of the thermocouple 2 of millivolts up to a nominal voltage of the transistor 6, said nominal voltage being greater than approximately 1.5V. The nominal voltage of the transistor 6 is preferably approximately 3V.

The transistor 6 is a field-effect transistor, preferably a MOSFET type transistor. The transistor 6 comprises a gate terminal 6a, a drain terminal 6b and a source terminal 6c, an output terminal 5a of the voltage booster 5 being arranged connected to the gate terminal 6a of the transistor 6.

The transistor 6 acts as a switch. In particular, when it operates in the cutoff region there is no conduction between the source terminal 6c and the drain terminal 6b, so it operates as an open switch regardless of whether or not the thermocouple 2 detects the presence of flame. In the described embodiment, the transistor 6 allows the passage of current when it is powered with a voltage from 1.5 V, operating as a closed switch when it reaches the nominal voltage.

When the thermocouple 2 detects the presence of flame it generates a voltage, referred to as no-load voltage, which is amplified through the voltage booster 5. When the nominal voltage of the transistor 6 is reached, the transistor 6 operates as a closed switch, allowing the energization of the electromagnetic valve 7. The thermocouple 2 passes from working with no-load to working with a load from that time. From that time, virtually all the thermoelectric current generated in the thermocouple 2 passes directly through the transistor 6, the voltage booster 5 consuming very little current.

When the flame turns off, the thermocouple 2 starts to cool down and less thermoelectric current is generated. There comes a time in which the transistor 6 opens and the electromagnetic valve 7 is disengaged, closing the passage of gas towards the burner 10. The disengagement of the electromagnetic valve 7 is controlled by the transistor 6, i.e., before the electromagnetic valve 7 is disengaged because the sufficient current does not reach it when the thermocouple 2 cools down upon the flame of the corresponding burner being turned off, the transistor 6 opens, whereby current automatically does not reach the electromagnetic valve 7 and the electromagnetic valve 7 is disengaged.

In addition, the excess voltage which is generated in the voltage booster 5 once the transistor 6 has been powered so that it operates as a closed switch, i.e., when it is powered with the nominal voltage, can be used for other functions such as powering luminous indicators of the blinking led type, RFID or battery charging systems used in gas cooking appliances.

What is claimed is:

1. A thermoelectric safety assembly comprising:
   a thermocouple configured to detect a flame generated by a burner and to produce an electrical voltage in response to detecting the flame;
   an electromagnetic valve electrically coupled to the thermocouple and configured to allow a passage of gas towards the burner when the electromagnetic valve is energized by the thermocouple;
   a field-effect transistor electrically connected between the thermocouple and the electromagnetic valve and transitional between an open state and a closed state, in the open state a current generated by the thermocouple is not allowed to pass through the field-effect transistor, in the closed state the current generated by the thermocouple is allowed to pass through the field-effect transistor, the electromagnetic valve being electrically coupled to the field-effect transistor; and
   a voltage booster configured to power the field-effect transistor and being connected in parallel with the field-effect transistor, an output terminal of the voltage booster being arranged connected with a gate terminal of the field-effect transistor, the voltage booster being configured to boost the electrical voltage generated in the thermocouple so that the electrical voltage is sufficient to cause the field-effect transistor to assume the closed state to allow a current to flow from the thermocouple through the field-effect transistor to energize the electromagnetic valve.

2. The thermoelectric safety assembly according to claim 1, wherein upon the flame not being detected by the thermocouple, a de-energizing of the electromagnetic valve occurs by the field-effect transistor assuming the open state to prevent current to flow from the thermocouple to the electromagnetic valve.

3. The thermoelectric safety device according to claim 1, wherein the field- effect transistor is a metal-oxide-semiconductor field-effect transistor.

4. The thermoelectric safety device according to claim 2, wherein the field-effect transistor is a metal-oxide-semiconductor field-effect transistor.

5. A gas combustion system comprising:
a gas burner;
a thermocouple configured to detect a flame generated by the burner and to produce an electrical voltage in response to detecting the flame;
an electromagnetic valve electrically coupled to the thermocouple and configured to allow a passage of gas towards the burner when the electromagnetic valve is energized by the thermocouple;
a field-effect transistor electrically connected between the thermocouple and the electromagnetic valve and transitional between an open state and a closed state, in the open state a current generated by the thermocouple is not allowed to pass through the field-effect transistor, in the closed state the current generated by the thermocouple is allowed to pass through the field-effect transistor, the electromagnetic valve being electrically coupled to the field-effect transistor; and
a voltage booster configured to power the field-effect transistor and being connected in parallel with the field-effect transistor, an output terminal of the voltage booster being arranged connected with a gate terminal of the field-effect transistor, the voltage booster being configured to boost the electrical voltage generated in the thermocouple so that the electrical voltage is sufficient to cause the field-effect transistor to assume the closed state to allow a current to flow from the thermocouple through the field-effect transistor to energize the electromagnetic valve.

6. The thermoelectric safety assembly according to claim 5, wherein upon the flame not being detected by the thermocouple, a de-energizing of the electromagnetic valve occurs by the field-effect transistor assuming the open state to prevent current to flow from the thermocouple to the electromagnetic valve.

7. The thermoelectric safety device according to claim 5, wherein the field-effect transistor is a metal-oxide-semiconductor field-effect transistor.

8. The thermoelectric safety device according to claim 6, wherein the field-effect transistor is a metal-oxide-semiconductor field-effect transistor.

* * * * *